United States Patent [19]
Harada

[11] Patent Number: 5,488,370
[45] Date of Patent: Jan. 30, 1996

[54] ANALOG-TO-DIGITAL CONVERTER

[75] Inventor: Hirotaka Harada, Tokyo, Japan

[73] Assignee: NEC Corporation, Tokyo, Japan

[21] Appl. No.: 272,679

[22] Filed: Jul. 8, 1994

[30] Foreign Application Priority Data

Aug. 23, 1993 [JP] Japan .................................. 5-207457

[51] Int. Cl.⁶ .................................................. H03M 1/42
[52] U.S. Cl. ........................................................ 341/161
[58] Field of Search .................................. 341/161, 155, 341/166, 143, 131

[56] References Cited

U.S. PATENT DOCUMENTS 4,293,848  10/1981  Cheng et al. ............................ 341/136
4,912,423  3/1990  Milkovic et al. ............................ 330/9

FOREIGN PATENT DOCUMENTS 61-126823  6/1986  Japan .

*Primary Examiner*—Brian K. Young
*Attorney, Agent, or Firm*—Whitham, Curtis, Whitham & McGinn

[57] ABSTRACT

The A-D converter of the present invention is a sequential comparing A-D converter having a chopper stable comparator built therein and comprises: using on/off switches each in the form of an NMOS FET, a third on/off switch interposed between a first input terminal of a differential amplifier and a grounding terminal for opening or closing the connection between the terminals, a fourth on/off switch interposed between a second input terminal of the differential amplifier and the grounding terminal for opening or closing the connection between the terminals, a fifth on/off switch interposed between the first and second input terminals of the differential amplifier for opening or closing the connection between the terminals, and a NOR circuit for inputting a boosting signal φ from the front and the rear of an inverter, and a condenser whose one terminal is grounded and which outputs a driving pulse to the gates of the three third, fourth and fifth on/off switches.

6 Claims, 4 Drawing Sheets

ANALOG-TO-DIGITAL CONVERTER

DETAILED DESCRIPTION OF THE INVENTION

1. Field of the Invention

This invention relates to an analog-to-digital converter, which is hereinafter referred to as an A-D converter, and more particularly to an A-D converter of the sequential comparing type which has a built-in chopper stable comparator and for which a high degree of accuracy is required.

2. Background of the Related Art

An A-D converter of the sequential comparing type is constituted from a digital-to-analog (D-A) converter, a comparator, and a feedback loop including a register for sequential comparison and a control logic. A voltage Vi of an inputted analog signal is adjusted equal to an output voltage Vd of the D-A converter by the control logic, and a digital value inputted to the D-A converter is then outputted as an output digital value of the A-D converter.

In order to adjust the D-A converter output voltage Vd and the analog input voltage Vi to the same value, the most significant bit (MSB) of the D-A converter is set to 1, and the output Vd (½ of the full scale Vs of a reference voltage) of the D-A converter and the analog input voltage Vi are then compared with each other by the comparator. If the result of comparison reveals Vi>Vd (=Vs/2), the MSB=1 is maintained, but if Vi<Vd, the MSB is reset to MSB=0 and the output Vd of the D-A converter is then adjusted to (¾)Vs or Vs/4 to perform a comparing operation for the second bit. Digital values up to the least significant bit (LSB) are determined in a similar manner.

FIG. 1A shows an example of a circuit construction of a conventional A-D converter of the sequential comparing type.

Referring to FIG. 1A, an analog signal inputted from an input terminal 301 for an analog signal is sampled and inputted to a condenser 317 when switches 316 and 318 are in an on-state and another switch 320 is in an off-state. Simultaneously, a further switch 322 is turned on so that a power source voltage Vd is applied between the two electrodes of another condenser 321. Thereafter, the switches 316, 318 and 322 are switched off so that the analog input signal is held by the condenser 317, and thereafter, the switch 320 is switched on so that sequential comparison is performed. A result of the conversion is held by a sequential comparing register 315.

Generally in an A-D converter which has a built-in chopper stable comparator in which an analog input signal is sampled and held by a condenser, when there is a potential difference between a preceding analog input signal voltage and a following analog input signal voltage, a so-called rush current flows instantaneously due to charging and discharging of the condenser upon sampling of the following analog input signal.

In order to reduce the rush current to allow conversion of an analog signal with a high degree of accuracy even where the resistance of the signal source is high, an A-D converter shown in FIG. 1B is disclosed in Japanese Patent Laid-open No. 61-126823/1986.

The A-D converter of the second example switchably inputs a comparison reference voltage of the output of a D-A converter 314 or the voltage at a middle point of the output of the D-A converter 314 between two input terminals of a sampling condenser 305 and a differential amplifier 308.

However, the A-D converter of the second conventional example described above requires a condenser having a low bias dependency in order to enhance the accuracy, and to this end, a production step such as a two-layer polycrystalline silicon formation step must be added. Generally, in order to minimize the production steps, a MOS condenser having an N well at one end thereof is employed.

Meanwhile, as a countermeasure for a high bias dependency as in the first conventional example of FIG. 1A, the comparison reference voltage Vd is applied to a terminal of the condenser upon sampling of an analog signal. Since the potential at the input terminal of the differential amplifier 308 is higher than Vd when an analog signal is inputted, where the switch 318 is formed from a P-channel MOS FET, a forward bias is applied to the N well and a P-type diffused layer which form a switch, and consequently, charge held in the condenser 317 leaks. Accordingly, the switches 318 and 322 are formed from N-channel MOS FETs, and upon on-operation, their gates are boosted to reduce their channel resistances.

However, there is an upper limitation in the boosted potentials from the point of view of the voltage resisting property of the gate, and since the gate cannot be boosted sufficiently, the on-resistance of an N-channel MOS FET constituting each switch becomes high and the terminal potential of the condenser does not become equal to Vd. As a result, there is a drawback that the conversion accuracy tends to deteriorate.

SUMMARY OF THE INVENTION

It is an object of the present invention to provide an A-D converter wherein, by eliminating the drawback described above, a switch for a circuit for supplying a reference voltage to an input terminal of a differential amplifier can be switched on even if the gate of the switch cannot be boosted sufficiently.

According to the present invention, an analog-to-digital converter with a built-in chopper stable comparator which includes a differential amplifier for differentially amplifying a voltage inputted thereto from a first input terminal to which an analog signal to be converted into a digital signal is inputted by way of a first capacitive element and a second input terminal to which a reference voltage is inputted by way of a second capacitive element, a sequential comparing register for outputting a digital signal in response to an output signal of the differential amplifier, a digital-to-analog (D-A) converter for outputting an analog signal in response to the digital signal outputted from the sequential comparing register, and an inputting circuit for switching the signal to be supplied to the first input terminal of the differential amplifier between the output signal of the D-A converter and the analog input signal to be converted into a digital signal, comprises:

short-circuiting means for intermittently short-circuiting the first and second input terminals;

grounding means for grounding the first and second input terminals; and driving means for driving the short-circuiting means and the grounding means.

The A-D converter comprises:

an N-channel MOS FET serving as a first switch and having a source connected to the first input terminal of the differential amplifier and a drain connected to the voltage source;

another N-channel MOS FET serving as a second switch and having a source connected to the second input terminal of the differential amplifier and a drain connected to the voltage source;

another N-channel MOS FET serving as a third switch having a source connected to the first input terminal of the differential amplifier and a drain connected to a grounding terminal;

another N-channel MOS FET serving as a fourth switch having a source connected to the second input terminal of the differential amplifier and a drain connected to the grounding terminal;

another N-channel MOS FET serving as a fifth switch having a source connected to the first input terminal of the differential amplifier and a drain connected to the second input terminal of the differential amplifier;

a booster for boosting the voltage to be supplied to the gates of the N-channel MOS FETs of the first and second switches; and a pulse wave generation circuit for supplying a pulse wave to the gates of the MOS FETs of the third, fourth and fifth switches only for a predetermined period upon starting of boosting of the booster.

Further, the A-D converter may comprise a first booster for boosting the gate voltages of the first and second N-channel MOS FETs, a pulse wave generation circuit for supplying the pulse wave to the gates of the third and fourth N-channel MOS FETs, and a second booster for boosting the gate voltage of the fifth N-channel MOS FET.

Preferably, all of the first to fifth N-channel MOS FETs have low threshold levels.

Since a pulse wave is supplied to the gates of the third, fourth and fifth MOS FETs only for the predetermined time upon starting of boosting of the booster or boosters, the first and second input terminals of the differential amplifier are grounded and short-circuited to an equal potential for the period.

Since the A-D converter of the present invention has the construction described above, when an analog input signal is to be sampled, excessive charge accumulated in the condenser can be discharged. Consequently, the object of the invention to enhance the accuracy of the A-D converter can be achieved.

The above and other objects, features, and advantages of the present invention will become apparent from the following description referring to the accompanying drawings which illustrate examples of the preferred embodiments of the present invention.

DESCRIPTION OF THE PREFERRED EMBODIMENTS

Figure 1A:
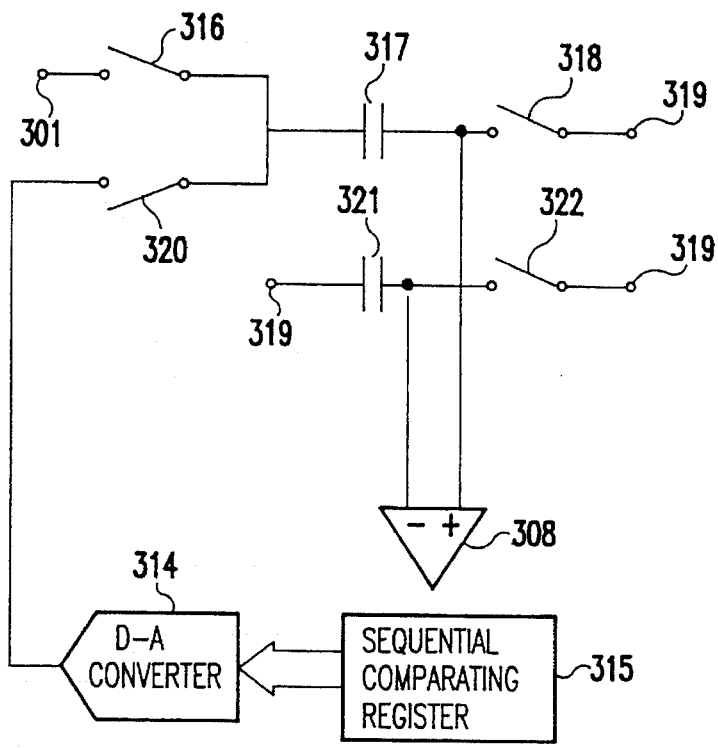
FIG. 1A is a block circuit diagram of a first conventional example of an A-D converter.
Figure 1B:
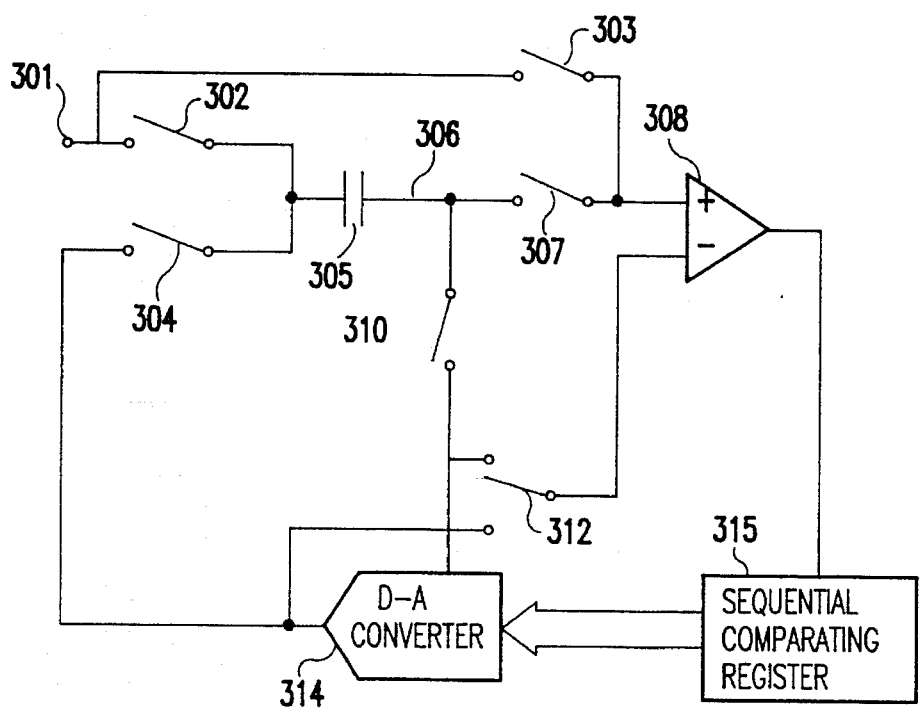
FIG. 1B is a block circuit diagram of a second conventional example of an A-D converter.
Figure 2:
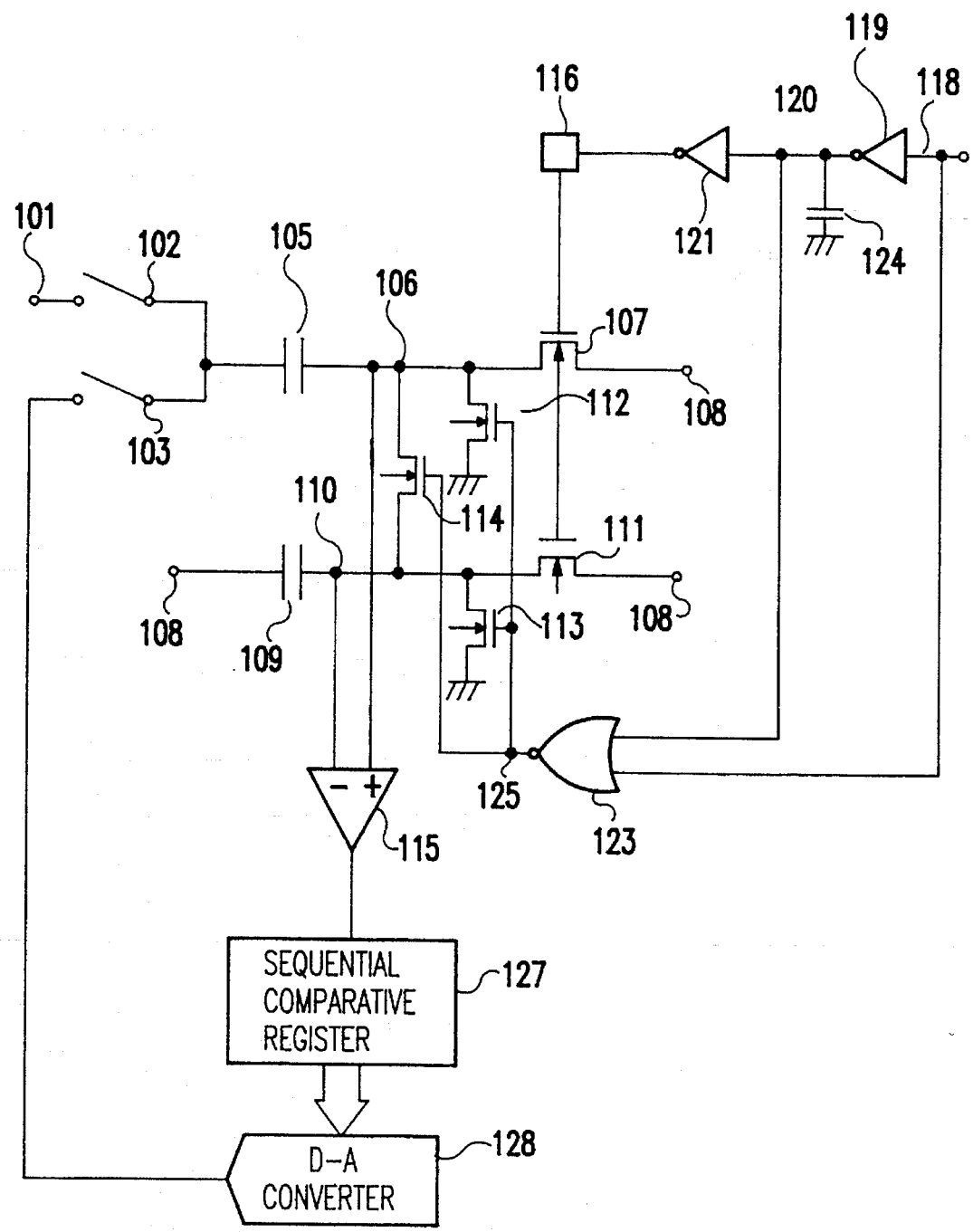
FIG. 2 is a block circuit diagram showing the construction of a first embodiment of the present invention.

Referring to FIG. 2, the A-D converter of the present embodiment includes circuits, which are hereinafter described, added to a conventional A-D converter.

In particular, the conventional A-D converter employed in the A-D converter of the present embodiment includes:

a condenser 105 for inputting and temporarily holding an analog input signal voltage inputted from an input terminal 101 for an analog signal by way of a switch 102 and for receiving an output voltage of a D-A converter 128 applied thereto in response to switching of a switch 103, another condenser 109 having a pair of terminals to which a power source voltage from a power source input terminal 108 and a comparison reference voltage are applied, a differential amplifier 115 for inputting the outputs of the condensers by way of first and second input terminals 106 and 110, respectively, to differentially amplify their voltages, a sequential comparing register 127 for converting the output of the differential amplifier 115 into a digital signal and for controlling the components of the A-D converter, a D-A converter 128 for converting the thus converted digital signal into an analog signal and feeding back the analog signal to the input side of the differential amplifier 115, an N-channel MOS FET 107 interposed between the first input terminal 106 of the differential amplifier 115 and the reference power source 108 and serving as a first switch 107 for switching between sampling and holding in response to the output of a booster 116 applied to the gate thereof, and another N-channel MOS FET 111 interposed between the second input terminal 110 of the differential amplifier 115 and the reference power source 108 and serving as a second switch 111 for applying the comparison reference voltage to the condenser 109 in response to the output of the booster 116 applied to the gate thereof.

The A-D converter of the present embodiment comprises, in addition to the conventional A-D converter described above, another N-channel MOS FET 112 interposed between the first input terminal 106 and a grounding terminal and serving as a third switch 112 for opening or closing the connection between the two terminals, another N-channel MOS FET 113 interposed between the second input terminal 110 and the grounding terminal and serving as a fourth switch 113 for opening or closing the connection between the terminals, another N-channel MOS FET 114 interposed between the first and second input terminals 106 and 110 and serving as a fifth switch 114 for opening or closing the connection between the input terminals, and a NOR circuit 123 for inputting a boosting signal $\phi$ from the front and the rear of an inverter 119 and a condenser 124 whose one terminal is grounded and which outputs a driving pulse to the gates of the N-channel MOS FETs 112, 113 and 114 of the three switches.

The operation of the present circuit will next be described with reference to FIGS. 2 and 3.

Upon sampling an analog input signal, switch 102 is switched on and switch 103 is switched off, and an analog input signal from input terminal 101 is inputted to the input terminal of condenser 105. Simultaneously, boosting signal $\phi$ changes to "0" (a in FIG. 3). The potential at the output terminal 120 of the inverter 119 of the boosting signal circuit is reversed in response to the change. However, the timing of the reversal is delayed due to the presence of condenser 124 (b of FIG. 3). The output of the NOR circuit 123 forms a pulse wave (c of FIG. 3) between the two reversals a and b, and the three third, fourth and fifth switches are driven only for the period of the pulse wave to open the gates.

Accordingly, the potential at the first input terminal 106 on the output side of condenser 105 is reduced to "0" since excessive charge accumulated for the sampling period flows out to the grounding terminal.

Figure 3:
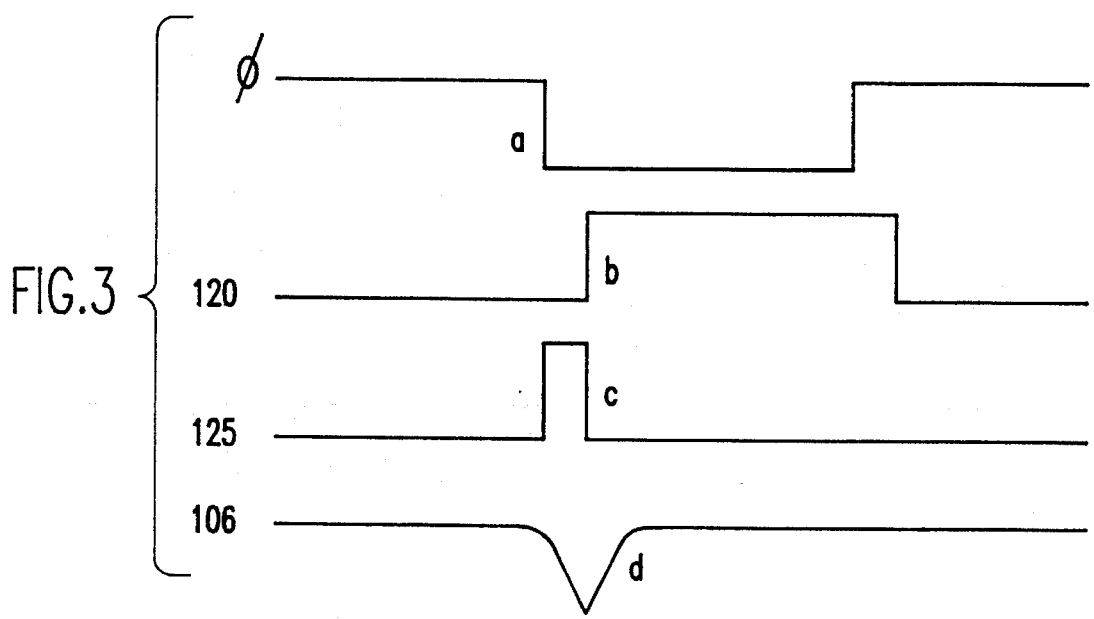
FIG. 3 is a timing chart of the embodiment of FIG. 2.

Thereafter, first and second switches 107 and 111 are driven into an on-state by booster 116, and consequently, the potential at the first input terminal 106 rises to the power source voltage Vd (d of FIG. 3). Simultaneously, switch 114 is switched on to allow the potentials at the two input terminals 106 and 110 of differential amplifier 115 to become equal to each other.

Accordingly, even if the first switch 107 is not boosted sufficiently and has a high resistance in its on-state, the potential at the first input terminal 106 can be made substantially equal to Vd, and in addition, the potential can also be made equal to the potential at the second input terminal 110.

Figure 4:
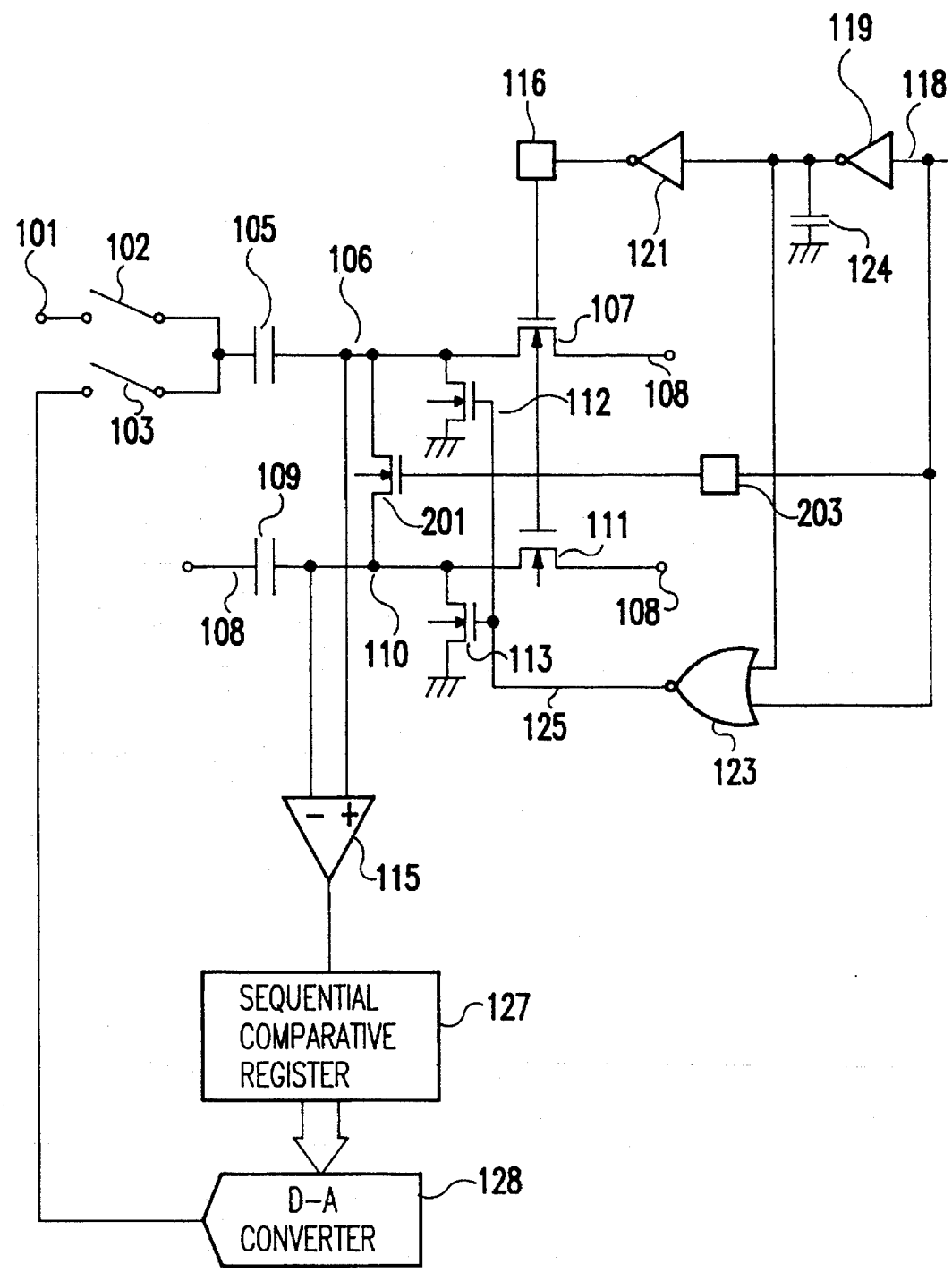
FIG. 4 is a block circuit diagram of a second embodiment of the present invention.

The second embodiment of the present invention will next be described with reference to FIG. 4.

The second embodiment is constructed so that the gate of N-channel MOS FET 201 of the fifth switch connected between the first input terminal 106 on the analog signal input side of the differential amplifier 115 and the second input terminal 110 on the comparison reference voltage input side of the differential amplifier 115 is driven independently of the gates of the other switches in response to the output of a booster 203 connected to boosting signal φ before it is inputted to inverter 119. Due to this construction, when first and second switches 107 and 111 are switched on so that the power source voltage is applied to the two input terminals 106 and 110, the potentials at the input terminals upon sampling can be further adjusted to an equal potential.

Similar effects can be obtained even where first to fifth switches 107 to 201 described above are replaced by N-channel MOS FETs having a low threshold level.

It is to be understood that variations and modifications of the digital-to-analog converter disclosed herein will be evident to those skilled in the art. It is intended that all such modifications and variations be included within the scope of the appended claims.

I claim:

1. An analog-to-digital converter which includes a differential amplifier having a first input terminal to which an analog signal to be converted into a digital signal is inputted by way of a first capacitive element and a second input terminal to which a reference voltage of a voltage source is inputted by way of a second capacitive element for differentially amplifying a voltage inputted thereto from said two input terminals and outputting an amplified voltage, a sequential comparing register for outputting a digital signal in response to an output signal of said differential amplifier, a digital-to-analog converter for outputting an analog signal in response to the digital signal outputted from said sequential comparing register, and an inputting circuit for switching the signal to be supplied to said first input terminal of said differential amplifier between the output signal of said digital-to-analog converter and the analog input signal to be converted into a digital signal, comprising:

short-circuiting means for intermittently short-circuiting said first and second input terminals;

grounding means for grounding said first and second input terminals; and driving means for driving said short-circuiting means and said grounding means.

2. An analog-to-digital converter as claimed in claim 1 comprising:

a first on/off switch for opening or closing the conductive connection between said first input terminal and said voltage source;

a second on/off switch for opening or closing the conductive connection between said second input terminal and said voltage source;

a third on/off switch for opening or closing the conductive connection between said first input terminal and a grounding terminal;

a fourth on/off switch for opening or closing the conductive connection between said second input terminal and said grounding terminal;

a fifth on/off switch as said short-circuiting means for opening or closing the conductive connection between said first input terminal and said second input terminal; and a driving circuit for driving said first to fifth on/off switches.

3. An analog-to-digital converter as claimed in claim 2, comprising said first to fifth on/off switches each in the form of an N-channel MOS FET, a first driving circuit serving as a booster for boosting the gate voltages of the N-channels MOS FETs of said first and second on/off switches, and a second driving circuit serving as a pulse generation circuit for supplying a pulse wave to the gates of the N-channel MOS FETs of said third, fourth and fifth on/off switches.

4. An analog-to-digital converter as claimed in claim 3, wherein all of the N-channel MOS FETs of said first to fifth on/off switches have low threshold levels.

5. An analog-to-digital converter as claimed in claim 2, comprising said first to fifth on/off switches each in the form of an N-channel MOS FET, a first driving circuit serving as a booster for boosting the gate voltages of the N-channels MOS FETs of said first and second on/off switches, a second driving circuit serving as a pulse generation circuit for supplying a pulse wave to the gates of the N-channel MOS FETs of said third and fourth on/off switches, and a third driving circuit serving as a booster for boosting the voltage of the gate of the N-channel MOS FET of said fifth on/off switch.

6. An analog-to-digital converter as claimed in claim 5, wherein all of the N-channel MOS FETs of said first to fifth on/off switches have low threshold levels.

* * * * *